United States Patent
Li et al.

(10) Patent No.: US 8,050,727 B2
(45) Date of Patent: Nov. 1, 2011

(54) SLIDE MECHANISM FOR SLIDE-TYPE TERMINAL DEVICE

(75) Inventors: Jian Li, Shenzhen (CN); Jin-Xin Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 827 days.

(21) Appl. No.: 12/126,986

(22) Filed: May 26, 2008

(65) Prior Publication Data
US 2009/0163259 A1    Jun. 25, 2009

(30) Foreign Application Priority Data

Dec. 24, 2007   (CN) .......................... 2007 1 0203362

(51) Int. Cl.
*H04M 1/00* (2006.01)
(52) U.S. Cl. ............... 455/575.4; 455/575.1; 455/575.8; 379/433.12
(58) Field of Classification Search ............... 455/575.4, 455/575.1, 575.8; 379/433.12
See application file for complete search history.

(56) References Cited

U.S. PATENT DOCUMENTS

| | | | | |
|---|---|---|---|---|
| 5,832,098 A * | 11/1998 | Chen | | 381/370 |
| 6,731,956 B2 * | 5/2004 | Hanna et al. | | 455/569.1 |
| 6,816,363 B2 * | 11/2004 | Yamamoto | | 361/679.3 |
| 7,102,881 B2 * | 9/2006 | Park et al. | | 361/679.08 |
| 7,376,449 B2 * | 5/2008 | Mizuta et al. | | 455/575.3 |
| 7,869,844 B2 * | 1/2011 | Lee et al. | | 455/575.4 |
| 2006/0073858 A1 * | 4/2006 | Nagashima | | 455/575.4 |
| 2007/0091555 A1 * | 4/2007 | Lee | | 361/683 |
| 2007/0155448 A1 * | 7/2007 | Hong | | 455/575.4 |
| 2007/0243912 A1 * | 10/2007 | Lee et al. | | 455/575.4 |
| 2008/0153558 A1 * | 6/2008 | Mifune et al. | | 455/575.4 |
| 2010/0022286 A1 * | 1/2010 | Wang et al. | | 455/575.4 |

* cited by examiner

*Primary Examiner* — Duc M Nguyen
(74) *Attorney, Agent, or Firm* — Altis Law Group, Inc.

(57) ABSTRACT

An exemplary slide mechanism (100) includes a rear cover (20), a front cover (30), and a coil spring (50). The front cover is slidably attached to the rear cover. The coil spring connected is configured for creating an elastic force to make the front cover slide relative to the rear cover. The coil spring includes a coiled portion (52) connected to the front cover, a free portion (54) connected to the rear cover, and a connecting portion (56) connecting the coiled portion and the free portion.

18 Claims, 4 Drawing Sheets

SLIDE MECHANISM FOR SLIDE-TYPE TERMINAL DEVICE

BACKGROUND OF THE INVENTION

1. Field of the Invention

The present invention relates to slide mechanisms, and more particularly to a slide mechanism for a slide-type terminal device.

2. Discussion of the Related Art

Sliding mechanisms are widely used in slide-type terminal devices, such as sliding-type mobile phones and sliding-type personal digital assistants (PDAs). The slide-type terminal device usually has two housings. One housing slides over the other housing, thereby opening or closing the terminal device.

Referring to FIG. 4, a typical sliding mechanism generally includes a first sheet 11, a second sheet 12, and a sliding module 13 for linking the first and the second sheets 11, 12. The first sheet 11 is slidable relative to the second sheet 12. The first and the second sheets 11, 12 are fixed on a display unit and a main unit correspondingly, of a slide-type terminal device. The sliding module 13 includes a first linking member 131, a first pivot shaft 132, a second linking member 133, a second pivot shaft 134, a first sliding sleeve 136, a second sliding sleeve 138, and a spring 139. The first linking member 131 is rotatably attached to the first sheet 11 by the first pivot shaft 132, and the second linking member 133 is rotatably attached to the second sheet 12 by the second pivot shaft 134. An end of the first sliding sleeve 136 is fixed to the first linking member 131, and an end of the second sliding sleeve 138 is fixed to the second linking member 133. Another end of the second sliding sleeve 138 opposite to the second linking member 133 is inserted into the first sliding sleeve 136. The spring 139 is received in the first and the second sliding sleeves 136, 138. A first end of the spring 139 is fixed to the first linking member 131 and a second end of the spring 139 opposite to the first end is fixed to the second linking member 133.

When the display unit is in a closed position, the first sheet 11 is positioned at a first end of the second sheet 12 and the spring 139 is slightly compressed. In an opening process, the display unit is slid opened by an external force from the main unit, the first sheet 11 moves towards a second end opposite to the first end of the second sheet 12, the spring 139 gradually compresses thereby accumulating potential energy and the second sliding sleeve 138 is further slid into the first sliding sleeve 136. The first and the second sliding sleeves 136, 138 are also rotated relative to the first and pivot shaft 132, 134 correspondingly. When the first sheet 11 reaches a middle position of the second sheet 12, the spring 139 is compressed to a shortest length and the second sliding sleeve 138 are fully slid into the first sliding sleeve 136. Because the first sheet 11 passes the middle position of the second sheet 12, the potential energy of the spring 139 creates an elastic force to push the first sheet 11 to slide further until the first sheet 11 is fully opened relative to the second sheet 12. The process of closing the display unit with the first sheet 11 and the above-described opening process are substantially in the same manner.

However, the spring 139 is compressed to a shortest length in the middle position and creates a largest force to the first sheet 11 when passing the middle position, thus the first sheet 11 easily wobbles with the sliding mechanism. Therefore, the sliding first sheet 11 does not slide stably relative to the second sheet 12. In addition, the first and the second sliding sleeves 136, 138 increase a thickness of the slide mechanism.

Therefore, a new slide mechanism which overcomes the above-described shortcomings is desired.

SUMMARY

A slide mechanism includes a rear cover, a front cover, and a coil spring. The front cover is slidably attached to the rear cover. The coil spring connected is configured for creating an elastic force to make the front cover slide relative to the rear cover. The coil spring includes a coiled portion connected to the front cover, a free portion connected to the rear cover, and a connecting portion connecting the coiled portion and the free portion.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the slide mechanism. Moreover, in the drawings, like reference numerals designate corresponding parts throughout the several views.

DETAILED DESCRIPTION OF THE EMBODIMENTS

Reference will now be made to the drawings to describe preferred embodiments of the present sliding mechanism in detail.

Figure 1:
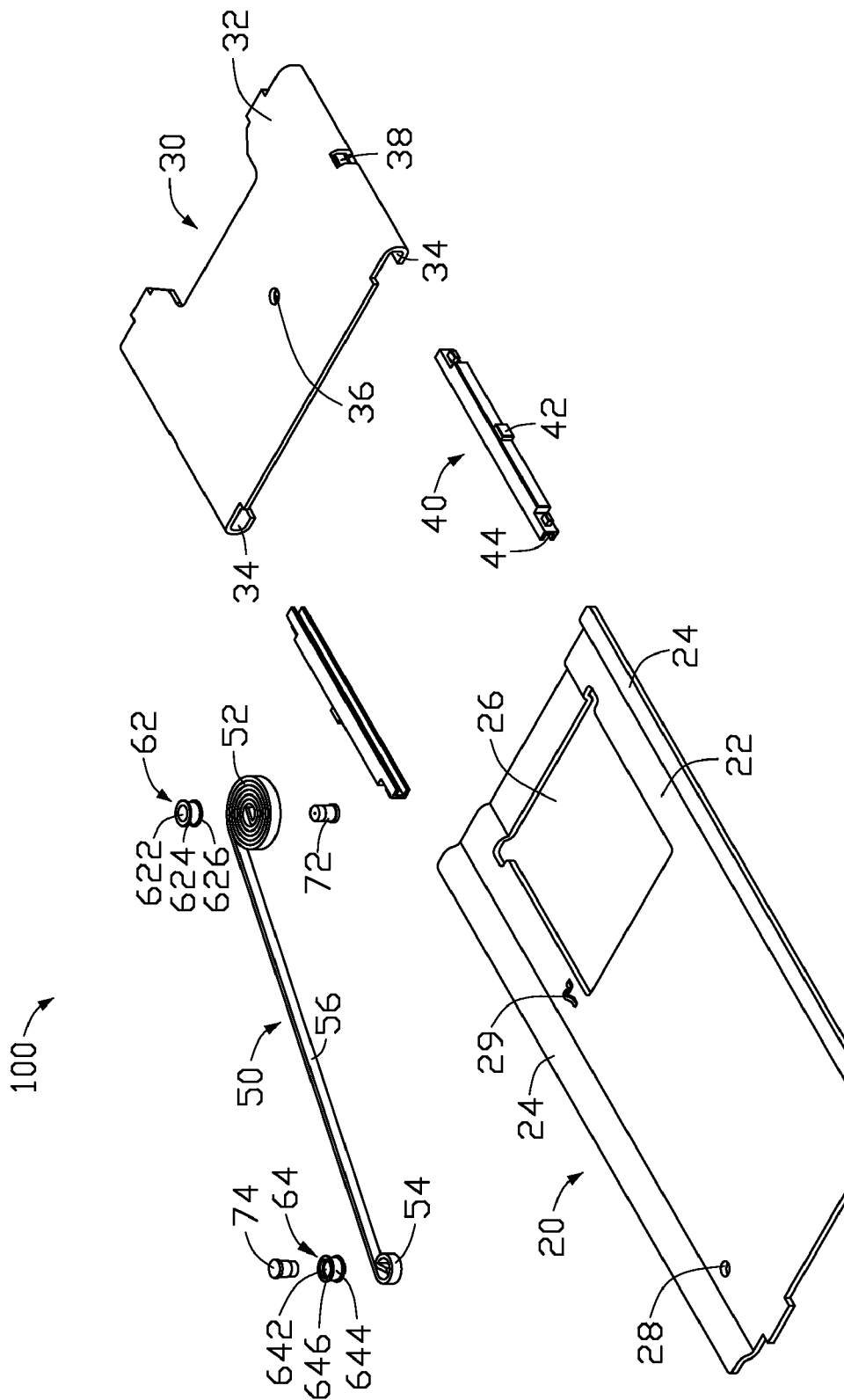
FIG. 1 is an exploded, isometric view of a slide mechanism in accordance with an exemplary embodiment of the present invention.

Referring to FIG. 1, a sliding mechanism 100 according to an exemplary embodiment of the present invention is adapted for use in a sliding-type terminal device such as a sliding-type mobile phone. The sliding mechanism 100 includes a rear cover 20, a front cover 30, two guiding rails 40, and a coil spring 50.

The rear cover 20 is substantially a flat sheet having a main plate 22 and two side strips 24 formed at opposite sides of the main plate 22. The side strips 24 extend along the sides of the main plate 22 correspondingly. The main plate 22 further defines a rectangular hole 26 adjacent to an end and a circular pinhole 28 adjacent to another end away from the rectangular hole 26. The pinhole 28 is adjacent to one of the side strips 24. The rear cover 20 further includes a resilient piece 29 positioned adjacent to the rectangular hole 26. The resilient piece 29 is substantially an arching clasp including a first end fixed to the main plate 22 and a second end opposite to the first end apart from the main plate 22. The second end of the resilient piece 29 is deformable.

The front cover 30 is substantially a flat sheet having a base 32 and defines two sliding grooves 34 at opposite ends of the base 32. The sliding grooves 34 are configured for engaging with the guiding rails 40 correspondingly. The front cover 30 defines a pinhole 36 in a middle portion. Each of the sliding grooves 34 is formed by bending a corresponding side portion of the base 32 inwards. The front cover 30 defines a fixing hole 38 in a middle of each of the corresponding side portions and the fixing hole 38 communicates with the corresponding sliding groove 34.

Each of the guiding rails 40 is substantially an elongated bar. A protrusion 42 is formed in a middle portion of each of the guiding rails 40. Each of the guiding rails 40 further defines a guiding groove 44. The protrusion 42 and the guiding groove 44 are at opposite sides of each guiding rail 40. The guiding grooves 44 are configured for engaging with the side strips 24 of the rear cover 20 correspondingly. In other words, the guiding rails 40 can slidably engage with the rear cover 20. The guiding rails 40 are securely received in the sliding grooves 34 correspondingly, with the protrusions 42 engaging in the fixing holes 38 of the front cover 30 correspondingly.

The coil spring 50 is formed by coiling an elastic strip along a predetermined coiling axis. The coil spring 50 includes a coiled portion 52, a free portion 54, and a connecting portion 56 connecting the coiled portion 52 and the free portion 54. The coiled portion 52 can be pulled out by the connecting portion 56, thereby elongating the connecting portion 56. The connecting portion 56 creates a substantially stable elastic force when the coiled portion 52 is pulled out in a predetermined elongating range.

The sliding mechanism 100 further includes a first coil wheel 62, a second coil wheel 64, a first rivet 72, and a second rivet 74. Each of the first and the second coil wheels 62, 64 defines a through hole 622, 642 in a middle, and includes a cylindrical outer surface 624, 644 respectively. The outer surface 624 of the first coil wheel 62 is configured to be coiled by the coiled portion 52 of the coil spring 50. The outer surface 644 of the second coil wheel 64 is configured to be coiled by the free portion 54 of the coil spring 50. Each of the first and the second coil wheels 62, 64 includes a pair of flanges 626, 646 formed at a top end and a bottom end correspondingly. The flanges 626, 646 are configured for preventing the coiled portion 52 and the free portion 54 to detach from the cylindrical outer surfaces 624, 644 of the coil wheels 62, 64. The first rivet 72 is configured to be passable through the through hole 622 of the first coil wheel 62 and fixed the first coil wheel 62 to the front cover 30. The second rivet 74 is configured to be passable through the through hole 642 of the second coil wheel 64 and fixing the second coil wheel 64 to the rear cover 20.

To assemble the slide mechanism 100, the coiled portion 52 of the coil spring 50, is coiled on the outer surface 624 of the first coil wheel 62, with a tip of the coiled portion 52 secured to the first coil wheel 62. The free portion 54 of the coil spring 50 is coiled on the outer surface 644 of the second coil wheel 64, with a tip of the free portion 54 secured to the second coil wheel 64. The first rivet 72 is inserted into the through hole 622 of the first coil wheel 62 and the pinhole 36 of the front cover 30, and an end of the first rivet 72 is riveted to the front cover 30. Thus, the first coil wheel 62 with the tip of the coiled portion 52 of the coil spring 50 is secured to the front cover 30 and a coiling axis of the coil spring 50 is perpendicular to the rear cover 20 and the front cover 30. The guiding rails 40 are fixedly received in the sliding grooves 34 of the front cover 30 correspondingly. The side strips 24 are received in the guiding grooves 44 of the guiding rails 40 correspondingly, thereby slidably mounting the front cover 30 and the guiding rails 40 to the rear cover 20. Finally, the second rivet 74 is inserted through the through hole 642 of the second coil wheel 64 and the pinhole 28 of the rear cover 20, and an end of the first rivet 72 is riveted to the front cover 20. Thus, the second coil wheel 64 with the tip of the free portion 52 of the coil spring 50 is secured to the rear cover 20.

Figure 2:
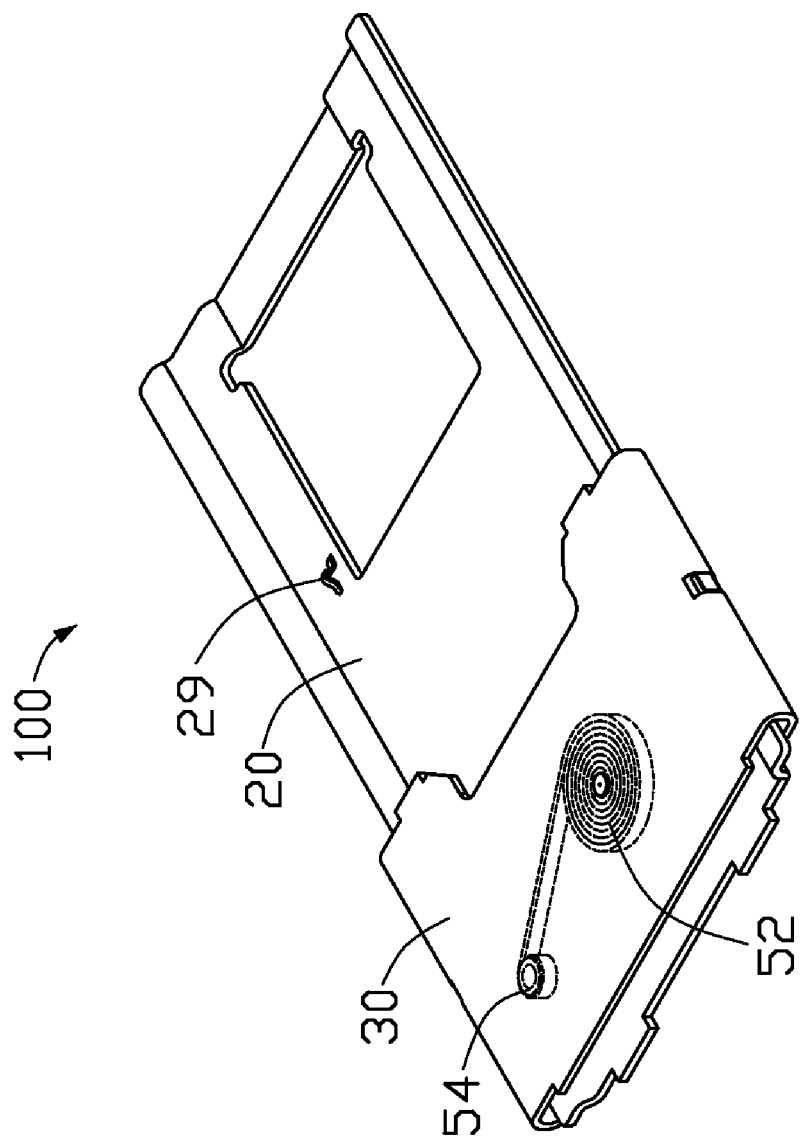
FIG. 2 is an assembled, isometric view of the slide mechanism of FIG. 1, showing a closed state of the slide mechanism.
Figure 3:
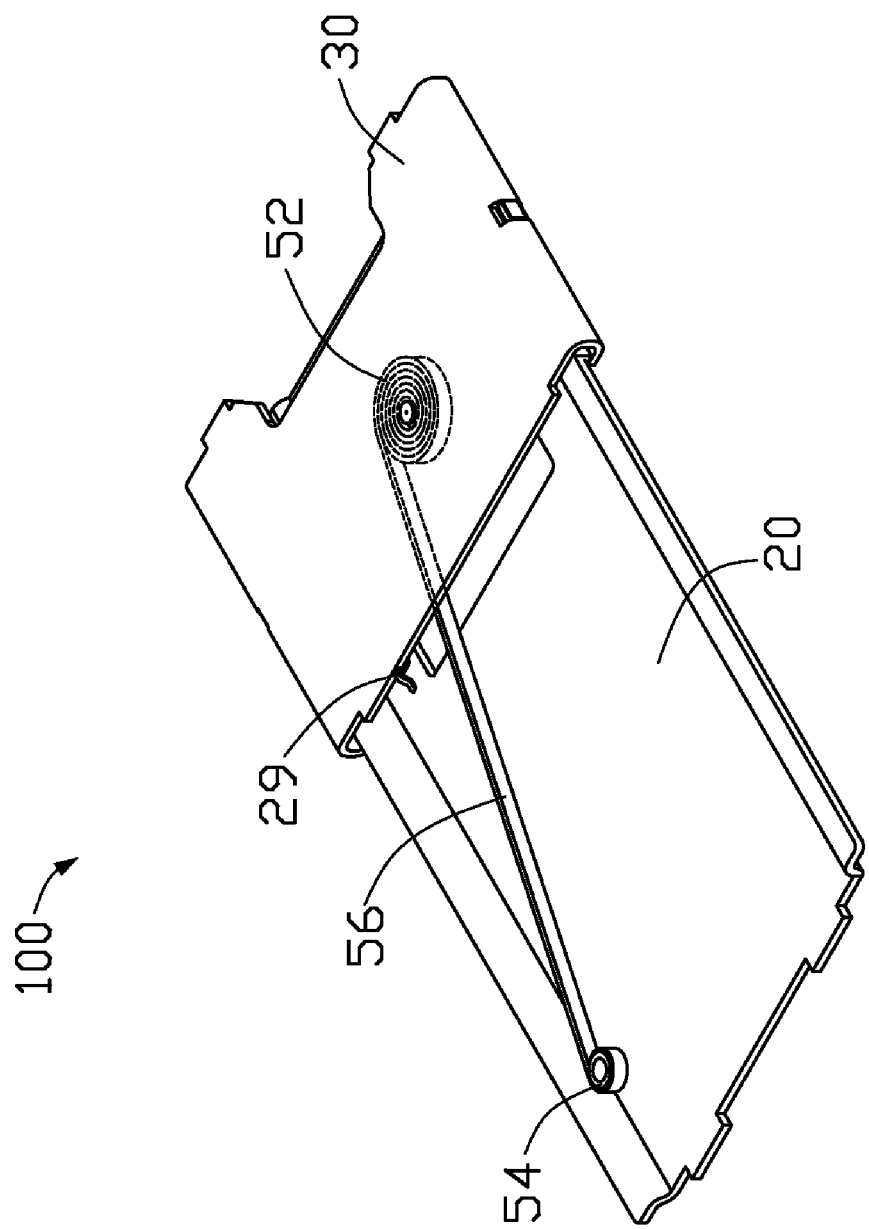
FIG. 3 is an assembled, isometric view of the slide mechanism of FIG. 1, showing an open state of the slide mechanism.
Figure 4:
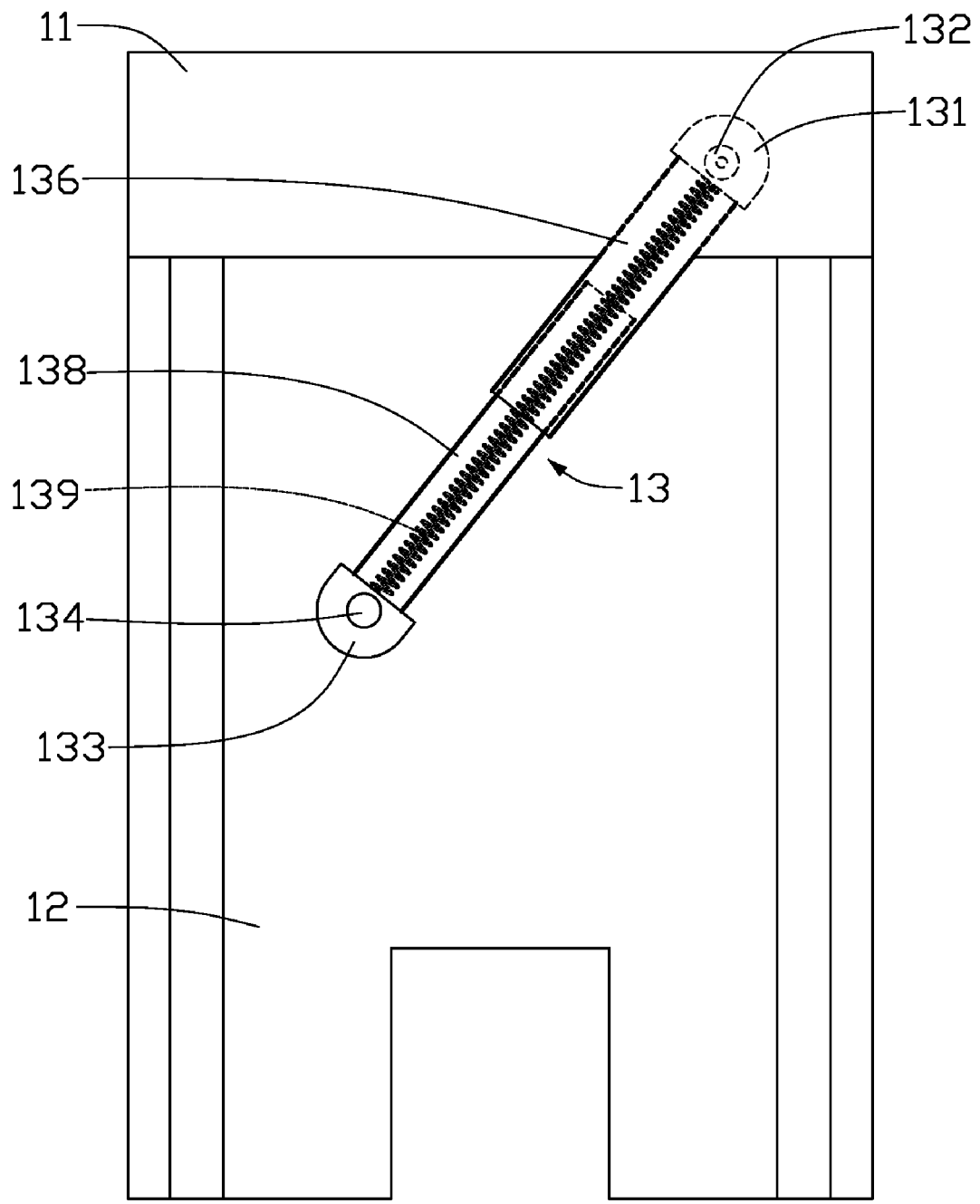
FIG. 4 is a schematic view of a conventional slide mechanism.

In use, referring to FIGS. 2 and 3, a working process is shown. FIG. 2 is an assembled, isometric view of the slide mechanism 100 in a closed state. In the closed state, the front cover 30 is positioned at a first end of the rear cover 20, and the coil spring 50 is in a coiled state. A length of the connecting portion 56 is at a shortest length when in the closed position. To change from the closed position to an opened position, the front cover 30 is manually moved from the first end to the second end of the rear cover 20. When moving the front cover 30, the coiled portion 52 of the coil spring is pulled out by the connecting portion 56 and becomes uncoiled until the slide mechanism 100 is in an open state shown in FIG. 3, thereby increasing the length of the connecting portion 56. In the opened state, the front cover 30 is fully opened relative to the rear cover 20, and the length of the connecting portion 56 of spring coil 50 is at a longest length and an end of the front cover 30 is blocked by the resilient piece 29. To change from the opened position to the closed position, the resilient piece 29 is pressed downwards by the end of the front cover 30. The front cover 30 is moved from the second end towards the first end of the rear cover 20 by an elastic force created by the spring coil 50 until the slide mechanism 100 returns to the closed state of FIG. 2.

The elastic force created by the coil spring 50 is substantially stable when the coiled portion 52 is pulled out in the predetermined elongating range, thus the first sheet 11 hardly wobbles with the sliding mechanism 100. Therefore, the sliding first sheet 11 slides stably relative to the second sheet 12. In addition, the coil spring 50 does not need to be mounted in an extra sliding sleeve, thus the slide mechanism 100 has a relatively small thickness.

It should be pointed out that, the resilient piece 29 may also be replaced by other latching members for retaining the slide mechanism 100 in the fully opened state. In addition, the coiled portion 52 of the coil spring 50 may be uncoiled in the closed state, thus when change from the closed position to an opened position, the length of the connecting portion 56 decreases and the coiled portion 52 of the coil spring 50 is coiled.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A slide mechanism, comprising:
   a rear cover;
   a front cover slidably attached to the rear cover;
   a coil spring configured for creating an elastic force to make the front cover slide relative to the rear cover, the coil spring including a coiled portion connected to the front cover, a free portion connected to the rear cover, and a connecting portion connecting the coiled portion and the free portion;
   a first coil wheel fixed to the front cover, and comprising a cylindrical outer surface configured to be coiled by the coiled portion of the coil spring; and
   a second coil wheel fixed to the rear cover, and comprising a cylindrical outer surface configured to be coiled by the free portion of the coil spring.

2. The slide mechanism as claimed in claim 1, wherein the slide mechanism further comprises a resilient piece fixed to the rear cover for blocking the front cover when the front cover slides to an end of the rear cover.

3. The slide mechanism as claimed in claim 2, wherein the rear cover is a flat sheet having a main plate, the resilient piece is an arching clasp including a first end fixed to the main plate of the rear cover and a second end opposite to the first end apart from the main plate, and the second end of the resilient piece is deformable.

4. The slide mechanism as claimed in claim 3, wherein the slide mechanism further comprises two guiding rails, each of the guiding rails defines a guiding groove, and the rear cover comprises two side strips formed at opposite sides of the main plate for slidably engaging in the guiding grooves of the guiding rails correspondingly.

5. The slide mechanism as claimed in claim 4, wherein each of the guiding rails is an elongated bar.

6. The slide mechanism as claimed in claim 4, wherein the front cover is a flat sheet having a base and defines two sliding grooves at opposite ends of the base, the guiding rails are securely received in the sliding grooves correspondingly.

7. The slide mechanism as claimed in claim 6, wherein each of the sliding grooves is formed by bending a side portion of the base inwards, the front cover defines a fixing hole in a middle of each side portion communicating with the corresponding sliding groove, a protrusion is formed in a middle portion of each of the guiding rails for engaging in the corresponding fixing hole.

8. The slide mechanism as claimed in claim 1, wherein each of the first and the second coil wheels comprises a pair of flanges formed at a top end and a bottom end correspondingly, the flanges are configured for preventing the coiled portion and the free portion to detach from the outer surfaces of the first and the second coil wheels.

9. The slide mechanism as claimed in claim 1, wherein the sliding mechanism further comprises a first rivet and a second rivet, each of the first and the second coil wheels defines a through hole in a middle, and the first rivet passes through the through hole of the first coil wheel and fixes the first coil wheel to the front cover, the second rivet passes through the through hole of the second coil wheel and fixes the second coil wheel to the rear cover.

10. The slide mechanism as claimed in claim 9, wherein the front cover defines a pinhole in a middle portion for fixing the first rivet, and the rear cover defines circular pinhole adjacent to an end for fixing the second rivet.

11. A slide mechanism, comprising:
a rear cover having a main plate and two side strips formed at opposite sides of the main plate;
a front cover;
two guiding rails fixed to opposite sides of front cover correspondingly, each of the guiding rails defines a guiding groove, and the side strips of the main plate slidably engaging in the guiding grooves of the guiding rails correspondingly;
a coil spring configured for creating an elastic force to make the front cover slide relative to the rear cover, the coil spring including a coiled portion connected to the front cover fixed to the front cover, a free portion connected to the rear cover, and a connecting portion connecting the coiled portion and the free portion;
a first coil wheel fixed to the front cover, and comprising a cylindrical outer surface configured to be coiled by the coiled portion of the coil spring; and
a second coil wheel fixed to the rear cover, and comprising a cylindrical outer surface configured to be coiled by the free portion of the coil spring.

12. The slide mechanism as claimed in claim 11, wherein the slide mechanism further comprises a resilient piece fixed to the rear cover for blocking the front cover when the front cover slide to an end of the rear cover.

13. The slide mechanism as claimed in claim 12, wherein the rear cover is a flat sheet, the resilient piece is an arching clasp including a first end fixed to the main plate of the rear cover and a second end opposite to the first end apart from the main plate, the second end of the resilient piece is deformable.

14. The slide mechanism as claimed in claim 13, wherein the front cover is a flat sheet having a base and defines two sliding grooves at opposite ends of the base, and the guiding rails are securely received in the sliding grooves correspondingly.

15. The slide mechanism as claimed in claim 14, wherein each of the sliding grooves is formed by bending a side portion of the base inwards, the front cover defines a fixing hole in a middle of each side portion communicating with the corresponding sliding groove, and a protrusion is formed in a middle portion of each of the guiding rails for engaging in the corresponding fixing hole.

16. The slide mechanism as claimed in claim 11, wherein each of the first and the second coil wheels comprises a pair of flanges formed at a top end and a bottom end correspondingly, and the flanges are configured for preventing the coiled portion and the free portion to detach from the outer surfaces of the first and the second coil wheels.

17. The slide mechanism as claimed in claim 11, wherein the sliding mechanism further comprises a first rivet and a second rivet, each of the first and the second coil wheels defines a through hole in a middle, and the first rivet passes through the through hole of the first coil wheel and fixes the first coil wheel to the front cover, the second rivet passes through the through hole of the second coil wheel and fixes the second coil wheel to the rear cover.

18. The slide mechanism as claimed in claim 17, wherein the front cover defines a pinhole in a middle portion for fixing the first rivet, and the rear cover defines circular pinhole adjacent to an end for fixing the second rivet.

* * * * *